United States Patent
Bielmeier et al.

(10) Patent No.: US 9,547,053 B2
(45) Date of Patent: Jan. 17, 2017

(54) METHOD FOR MONITORING PATIENT EXPOSURE IN A MAGNETIC RESONANCE DEVICE

(71) Applicants: Wolfgang Bielmeier, Nuremberg (DE); Matthias Gebhardt, Erlangen (DE); Juergen Nistler, Erlangen (DE); Dieter Ritter, Fuerth (DE); Volker Schnetter, Hoechstadt a.d. Aisch (DE)

(72) Inventors: Wolfgang Bielmeier, Nuremberg (DE); Matthias Gebhardt, Erlangen (DE); Juergen Nistler, Erlangen (DE); Dieter Ritter, Fuerth (DE); Volker Schnetter, Hoechstadt a.d. Aisch (DE)

(73) Assignee: Siemens Aktiengesellschaft, München (DE)

( * ) Notice: Subject to any disclaimer, the term of this patent is extended or adjusted under 35 U.S.C. 154(b) by 1064 days.

(21) Appl. No.: 13/707,363

(22) Filed: Dec. 6, 2012

(65) Prior Publication Data

US 2013/0147479 A1    Jun. 13, 2013

(30) Foreign Application Priority Data

Dec. 7, 2011   (DE) ......................... 10 2011 087 915

(51) Int. Cl.
*G01V 3/00*     (2006.01)
*G01R 33/32*    (2006.01)
(Continued)

(52) U.S. Cl.
CPC ............ *G01R 33/32* (2013.01); *G01R 33/36* (2013.01); *G01R 33/288* (2013.01); *G01R 33/5612* (2013.01)

(58) Field of Classification Search
CPC .................................................... G01R 33/288
(Continued)

(56) References Cited

U.S. PATENT DOCUMENTS 8,120,359 B2 *  2/2012  Diehl .................. G01R 33/288
                                                    324/309
8,442,616 B2 *  5/2013  Nistler ................ G01R 33/288
                                                    600/410

(Continued)

FOREIGN PATENT DOCUMENTS

DE   10 2008 063 630 A1   8/2010
JP         7246194 A      9/1995

OTHER PUBLICATIONS

German Office Action dated Aug. 3, 2012 for corresponding German Patent Application No. DE 10 2011 087 915.3 with English translation.

*Primary Examiner* — Louis Arana
(74) *Attorney, Agent, or Firm* — Lempia Summerfield Katz LLC

(57) ABSTRACT

A method for monitoring an exposure experienced by a patient during an examination with a magnetic resonance device having a transmitter device is provided. The method includes determining a coil power loss from measured amplitudes and phases of a first measuring device, and determining an overall transmitted power from voltage measurement values of the second measuring device. The method also includes determining a specific absorption rate (SAR) value describing a power entering a patient from the coil power loss and the overall transmitted power and comparing the SAR value with at least one limit value. A transmission operation of the transmitter device is terminated if the at least one limit value is exceeded.

21 Claims, 2 Drawing Sheets

(51) Int. Cl.
*G01R 33/36* (2006.01)
*G01R 33/28* (2006.01)
*G01R 33/561* (2006.01)

(58) Field of Classification Search
USPC ............................... 324/314, 309, 307, 300
See application file for complete search history.

(56) References Cited

U.S. PATENT DOCUMENTS

| | | | | |
|---|---|---|---|---|
| 8,547,097 | B2* | 10/2013 | Gebhardt | G01R 33/288 324/307 |
| 9,198,598 | B2* | 12/2015 | Kawamura | A61B 5/055 |
| 9,297,869 | B2* | 3/2016 | Albrecht | G01R 33/3614 |
| 2008/0182524 | A1 | 7/2008 | Graesslin et al. | |
| 2010/0167668 | A1 | 7/2010 | Nistler et al. | |
| 2010/0244840 | A1 | 9/2010 | McKinnon | |

* cited by examiner

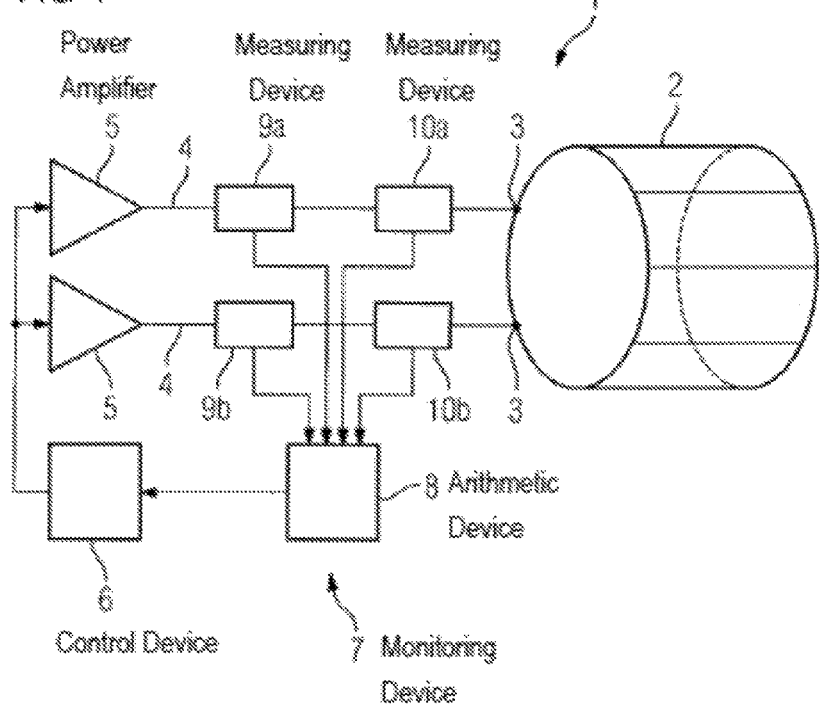

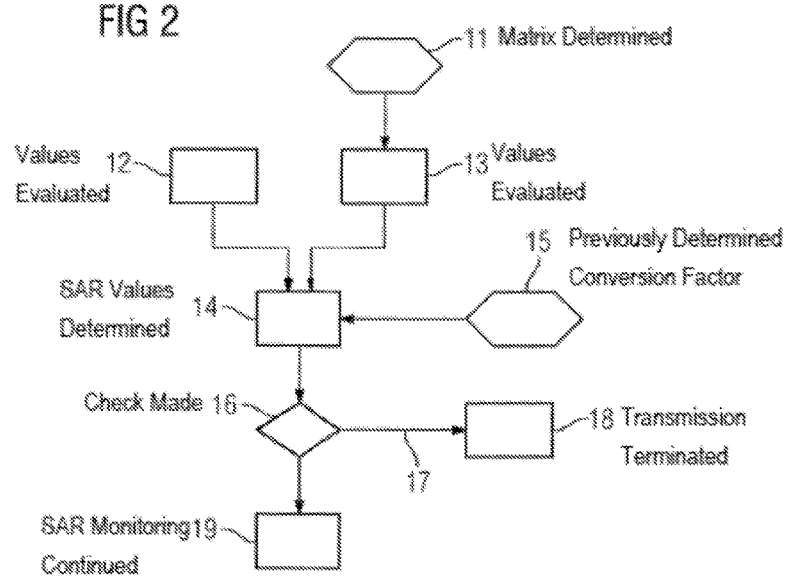
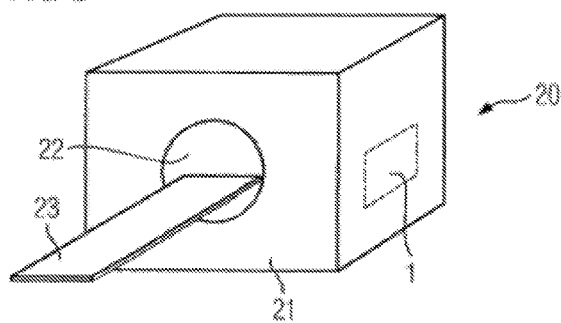

METHOD FOR MONITORING PATIENT EXPOSURE IN A MAGNETIC RESONANCE DEVICE

This application claims the benefit of DE 10 2011 087 915.3, filed on Dec. 7, 2011, which is hereby incorporated by reference.

BACKGROUND

The present embodiments relate to a method for monitoring an exposure experienced by a patient during an examination with a magnetic resonance device.

In magnetic resonance imaging, an excitation signal may be emitted via a high-frequency coil and excites nuclear spins aligned in a basic magnetic field. When this excitation decays, a magnetic resonance signal, from which a magnetic resonance image is generated, may be observed. High-frequency radiation generated using a corresponding transmitter device of the magnetic resonance device is used for the excitation.

The high-frequency radiation (e.g., a $B_1$ field) is absorbed in the body of the patient under examination and is converted into heat. This absorption may be described by the specific absorption rate (SAR) in relation to the patient's mass. Various standardization bodies lay down rules for monitoring the SAR for correspondingly powerful magnetic resonance devices in order to counter harm to the patient caused by too high a power being input.

Magnetic resonance devices may use a single-channel high-frequency-power amplifier in a transmitter device (e.g., circularly polarized high-frequency coils with two power supply terminals), the amplitude relationships and phase relationships being constant at both power supply terminals (e.g., identical amplitudes and 90° phase difference in the case of circular polarization). Magnetic resonance devices, in which the high-frequency coil may be actuated via several transmission channels, have been proposed. A power amplifier is associated, for example, with each of the transmission channels, the amplitudes and phases for the various transmission channels or power supply terminals being freely selectable. Embodiments, in which the number of power amplifiers does not correspond to the number of transmission channels (e.g., one power amplifier supplies at least two transmission channels via a corresponding interconnection, or one combined power supply is provided with several of the at least two power amplifiers), may also be provided.

The high-frequency power absorbed in the patient is determined as $$P_{abs}=P_{tx}-P_{loss},$$

where $P_{abs}$ describes the power absorbed in the patient, $P_{tx}$ describes the transmission power, and $P_{loss}$ describes the coil power loss. The specific absorption rate (SAR) is then $$SAR=P_{abs}/m$$

where m corresponds to the mass of the irradiated region of the patient.

When single-channel transmitter devices are used, the coil power loss stands in a fixed relationship to the transmission power, so that the SAR may be formulated, as follows:

$$SAR=k*P_{tx}.$$

The factor k includes the efficiency and the mass.

For such single-channel transmitter devices, SAR monitoring and, consequently, monitoring of the patient's exposure during an examination may be enabled using broadband power measurement devices between the power amplifier and the power supply terminals (e.g., the high-frequency coil). Broadband may be that the measurement, in which the real-value amplitude of the voltage may be measured, is not limited to a particular frequency band (e.g., a frequency band around the magnetic resonance frequency), but all frequencies may be measured. Broadband measuring devices of this type enable the transmission amplitude (e.g., a voltage amplitude) to be determined, from which the overall transmitted power follows, $P_{tx}$. With knowledge of the factor k and with correspondingly fast scanning, online monitoring during the transmission procedures may be provided.

In multi-channel transmission (e.g., parallel transmission, pTX), the factor k is no longer constant, but depends on the respective amplitude relationships and phase relationships. Consequently, a single measurement of transmission amplitudes is no longer sufficient.

In order to implement monitoring of patient exposure, broadband measuring devices may still be used and fixed factors for the amplitude relationships and phase relationships that are most harmful with respect to the specific absorption rate may be provided. This is disadvantageous in that performance is severely restricted if the actual coil power loss is significantly larger than the minimum possible that is to be applied without knowledge of the specific amplitude relationships and phase relationships for complying with SAR limit values.

In one embodiment, narrowband measuring devices that also supply phase information about the voltage as measured values in addition to the transmission amplitude may be used. The excitation pulses that are to effect the high-frequency excitation of the nuclear spins may be calculated (e.g., in a complex simulation), and a setpoint/actual-value comparison for online monitoring may be performed. The disadvantage of this variant is that independent SAR monitoring online by the actuation signal (e.g., the previously calculated excitation pulses) is no longer possible. Instead, only fixed, previously calculated pulse shapes with a prior SAR check may be used. Pulses other than the previously calculated excitation pulses may not be used, even if the pulses would not themselves cause the SAR to be exceeded. A long, safety-related chain is provided for SAR monitoring (e.g., the SAR prior calculation for each excitation pulse, the transfer of large amounts of data for the pulse shapes to a monitoring device, the comparison of the emitted excitation pulses with the expected excitation pulses, and complex error analyses in the case of small deviations from the setpoint signal).

DE 10 2008 063 630 A1 relates to a method for controlling a high-frequency transmitter device of a magnetic resonance tomography system with a transmitting antenna system with a plurality of transmission channels during a magnetic resonance measurement of an examination subject. A reference scatter parameter matrix of the transmitting antenna system is determined in the non-loaded state, and a subject-specific scatter parameter matrix of the transmitting antenna system is determined in a state loaded with the examination subject. Transmission amplitude vectors are determined on a time-dependent basis, and represent the high-frequency voltage amplitudes on the individual transmission channels. On the basis of the subject-specific scatter parameter matrix, the reference scatter parameter matrix and the transmission amplitude vectors, absorbed high-frequency power values are determined in the examination subject at particular transmission times and based on a plurality of the determined high-frequency power values a number of control values are formed. The high-frequency transmitter device is deactivated whenever a control value exceeds a predefined limit control value.

SUMMARY AND DESCRIPTION

The procedure described above is disadvantageous in that a complex prior measurement is necessary if a high-frequency coil is loaded (e.g., while the patient is already inside the magnetic resonance tomography system for the examination). The transmission amplitude vectors may only be determined with narrowband measuring devices, which provides that powers outside the frequency range under consideration (e.g., faults) may not be taken into account.

The present embodiments may obviate one or more of the drawbacks or limitations in the related art. For example, an improved method for monitoring patient exposure during a magnetic resonance examination that permits an SAR value to be determined in a robust, simple method independently of complicated prior calculations and calibration measurements is provided.

For each channel, a narrowband first measuring device configured to measure an amplitude and a phase of a voltage in a defined frequency range around a magnetic resonance frequency and a broadband second measuring device covering a wider frequency range than the first measuring device (e.g., the whole possible frequency range) and configured to record voltage measurement values suitable for determining an overall power are used. The method includes determining a coil power loss from the measured amplitudes and phases of the first measuring device, determining an overall transmitted power from the voltage measurement values of the second measuring device, and determining an SAR value describing the power entering the patient from the coil power loss and the overall power. The SAR value is compared with at least one limit value, and the transmission operation of the transmitter device is terminated if the limit value is exceeded.

Two measurements are made for each transmission channel between the power amplifier and the high-frequency coil (e.g., the power supply terminals). A first measuring device makes a narrowband measurement, which delivers an amplitude and a phase of the voltage, and a second measuring device makes a broadband measurement, which only delivers an amplitude. Both the overall power and also the coil power loss may be determined from these respective measured values, from which the power absorbed in the patient and consequently the SAR may be determined. If at least one limit value is exceeded by the at least one SAR value, the transmission operation is terminated (e.g., in that a control signal is transmitted to a control device via a monitoring device in order to deactivate the power amplifiers).

A combination of broadband and narrowband determination of the powers permits accurate monitoring of the global specific absorption rate independent of the excitation pulses, with several independent transmission channels being actuated without any need to make a selection. There is no restriction here on the performance or the number of excitation pulses as there is in the previous solutions described, nor are any complex calculations and calibration measurements on the patient necessary. An advantage is that due to the broadband measurement by the second measuring device, undesired or incorrectly emitted frequencies may be identified and monitored. These faults are thus ultimately "automatically" also covered. For example, since in the event of faults in secondary frequencies, the failure to take account of the coil power loss arising therefrom, which may not be detected because of the narrowband configuration of the first measuring device, is actually a benefit. The coil power loss would ultimately be subtracted from the overall power in order to determine the power absorbed in the patient, so that the SAR is, in the case of such faults, determined advantageously high. Thus, faults are identified earlier.

The present embodiments further permit, besides the simple, robust online monitoring of the SAR performed independently from prior calculations described, a comparison of measured values or values derived from the measured values with setpoint values originating from a prior calculation to be performed. The predicted SAR may thus also still be compared with the measured SAR, which has advantages when identifying system fault behavior. Thus, while a safe, robust and maximally independent option exists for online monitoring, which in the event of a fault in frequencies lying outside the frequency range of the first measuring device takes effect even earlier, setpoint/actual-value comparisons may also be undertaken with results from prior calculations.

A defined frequency range of less than 500 kHz around the magnetic resonance frequency may be used (e.g., of 250 kHz). For example, the narrowband first measuring device may be able to measure the amplitude and the phase of the transmission voltage in a frequency band of the magnetic resonance frequency +/−125 kHz.

The first measuring device and the second measuring device may be coupled via a directional coupler.

In one embodiment, using the second measuring device, the forward power and the reflected power are determined. The overall power is the difference between the forward power and the reflected power. In other words, not only is the outbound wave taken into account, but the return wave is taken into account too, so that power lost through reflection may also be taken into account when the overall power is determined. The total transmission power (e.g., the overall power) may be calculated as the forward power minus the reflected power.

For the actual calculation of the coil power loss from the measured values of the first measuring device, when determining the coil power loss from the amplitude and the phase, a previously determined scatter parameter matrix for the coil may be taken into account. The scatter parameter matrix discussed, which is advantageously determined in the context of a calibration measurement without patients, corresponds to the reference scatter parameter matrix also referred to in DE 10 2008 063 630 A1 (e.g., a scatter parameter matrix in the unloaded state without the load through the body or a body part of the patient to be examined). The scatter parameter matrix may be determined from the measured values of the first measuring device (e.g., by transmitting a defined high-frequency signal with a precisely determined shape and strength consecutively in time via each of the separate transmission channels). At each of the transmission channels (e.g., both at the transmission channel, via which the high-frequency signal is transmitted and also at the other transmission channels), at least one voltage value is determined for the return wave. In one embodiment, in addition, a second voltage value for an outbound wave may also be determined at each of the transmission channels. However, this measurement is only for control purposes, since on all transmission channels except the transmission channel, via which the high-frequency signal is transmitted, the voltage value for the outbound wave should be 0 in each case or at least approximately 0.

The idea of calculating a scatter parameter matrix is based on the fact that the high-frequency coil with its transmission channels may be understood as an N-gate network, where N corresponds to the number of transmission channels. The scatter parameters, consequently an N*N scatter parameter matrix that links the wave sizes outbound to the individual gates with the wave sizes moving away from these gates (B=S*A in abbreviated form) are used to describe a network of this type. B is the wave size vector of the return waves, S is the scatter parameter matrix, and A is the wave size vector of the outbound waves. The wave size vectors A and B are associated with the voltages across the impedance.

If the scatter parameter matrix is first known, the coil power loss may be determined from the measured values of the first measuring device. It may be sufficient if the scatter parameter matrix, which only relates to the unloaded state of the high-frequency coil, is determined once in advance or at regular intervals. If current influences and/or changes are to be taken into account, a calibration measurement may be undertaken before every examination or at more frequent intervals.

The SAR value may be determined using a conversion factor including the difference between the overall power and the coil power loss. Such conversion factors are, for example, already known from single-channel measurement methods and may also be used. A conversion factor dependent on the exposed region of the patient and/or the measuring accuracy of the measuring device may, for example, be used. Thus, for example, independent conversion factors exist for irradiations at the head or at other exposed body parts. The measurement accuracy of the measuring devices may also be mapped using the conversion factor such that, in each case, when the SAR is exceeded may be reliably detected.

The SAR value may be determined as a moving average over a predetermined time window (e.g., a time window of ten seconds and/or a time window of 360 seconds and/or by averaging the coil power loss and the overall power). For example, both the broadband measured values and the narrowband measured values may ultimately be averaged over particular time windows, before the SAR value is determined from the difference and the conversion factor that contains the mass and the measurement error. A time window moves across the power values, all power values being used in the time window to form the average value. Such a moving average is a very good measure of the radiation load, to which a patient is exposed. In this case, different moving time windows may be taken into account (e.g., a short-time control value over a ten-second-long window and a long-time control value over a 360-second-long window). In this way, a peak load on the patient is avoided, and no excessively high radiation load occurs overall, which, however, always remains slightly below the peak limit values. In an exemplary embodiment, even if the measured values are scanned more frequently, a check against the limit value may, for example, be made at particular time intervals (e.g., always at intervals of one second). If the limit value is exceeded, the further high-frequency emission may be prevented.

In one embodiment, the measured values may be scanned and processed in a digital signal processor. This enables particularly fast scanning and processing. Equivalent circuits in analog technology may also be used.

The aforementioned averaging of broadband and narrowband measured values of the overall power and the coil power loss need not necessarily take place at exactly the same times or intervals in time. Based on technical implementations (e.g., signal propagation delays or processing times), an asynchronicity that may be determined may occur. The resulting deviation may be regarded as an error in the respective result of an arithmetical operation (e.g., the SAR value).

A scatter parameter matrix may also be determined in the loaded state (e.g., to perform prior calculations). The scatter parameter matrix may additionally be used for comparison purposes. A simple, robust procedure independent from prior calculations is described for SAR monitoring.

In some embodiments, each transmission channel is assigned a power amplifier (e.g., the number of power amplifiers corresponds to the number of transmission channels). Other types of interconnection and assignments of power amplifiers to transmission channels may also exist.

Besides the method, a transmitter device for a magnetic resonance device is also provided. The transmitter device includes a high-frequency coil that may be actuated via several transmission channels and at least two power amplifiers for supplying power to the transmission channels. The transmitter device also includes a monitoring device with, for each transmission channel connected downstream of the power amplifier, a narrowband first measuring device configured to measure an amplitude and a phase of the voltage in a defined frequency range around the magnetic resonance frequency, and a broadband second measuring device covering a wider frequency range than the first measuring device (e.g., the whole possible frequency range) and configured to record voltage measurement values suitable for determining an overall power. The transmitter device includes an arithmetic device configured for the performance of the method. All embodiments relating to the method may be analogously transferred to the transmitter device, with which the same advantages may be achieved. For example, the number of power amplifiers may correspond to the number of transmission channels.

The arithmetic device may be configured as a digital signal processor (DSP). The measuring devices may be coupled via directional couplers to lines from the power amplifiers to the power supply terminals of the high-frequency coil. Essentially all measuring deices known in the prior art and having the desired attributes may be used as measuring devices.

A magnetic resonance device including a transmitter device is also provided. All explanations may be transferred to the method and to the transmitter device.

BRIEF DESCRIPTION OF THE DRAWINGS

FIG. 1 shows one embodiment of a transmitter device;
FIG. 2 shows a flow diagram of one embodiment of a method for monitoring patient exposure; and
FIG. 3 shows one embodiment of a magnetic resonance device.

DETAILED DESCRIPTION OF THE DRAWINGS

FIG. 1 shows a schematic diagram of one embodiment of a transmitter device 1 for a magnetic resonance device. A high-frequency coil 2 that has, for example, the form of a birdcage coil and has two power supply terminals 3 that are each assigned to a transmission channel 4 is provided.

Even though FIG. 1 shows a simple embodiment with just two transmission channels 4, a larger number of transmission channels may also be provided (e.g., eight or more transmission channels).

Each transmission channel 4 is assigned a separate power amplifier 5. The power amplifiers 5 are operated via a control device 6 for emitting excitation pulses via the high-frequency coil 2. The excitation pulses may have independently and freely selectable phases and amplitudes.

For SAR monitoring of a patient being examined using the magnetic resonance device, a monitoring device (e.g., represented by element 7) is provided. For the necessary calculations, the monitoring device 7 has an arithmetic device 8 (e.g., a digital signal processor (DSP)).

The arithmetic device 8 scans the measured values from measuring devices 9a, 9b and 10a, 10b. Each transmission channel 4 is assigned a pair of a first measuring device 9a, 9b and a second measuring device 10a, 10b. The first measuring devices 9a, 9b make narrowband measurements in a frequency range around the magnetic resonance frequency and deliver the amplitude and the phase of the voltage as measured values. The frequency range is selected such that measurements may, for example, be taken in a frequency band of +/−125 kHz around the magnetic resonance frequency.

The second measuring devices 10a, 10b are in contrast broadband. The second measuring devices 10a, 10b measure across a larger frequency range than the first measuring devices 9a, 9b (e.g., all possible frequencies that may be generated), including in cases of error. Unlike the first measuring devices 9a, 9b, which may deliver not only the amplitude of the voltage but also the phase of the voltage, the second measuring devices 10a, 10b deliver only the (real-value) amplitude of the voltage as a voltage measurement value.

The first measuring devices 9a, 9b and the second measuring devices 10a, 10b are each coupled via directional couplers (not further shown here).

The first measuring devices 9a, 9b and the second measuring devices 10a, 10b deliver measured values to the arithmetic device 8, which is configured to perform the method for monitoring of the patient exposure. At least one SAR value is determined from the measured values and is compared to at least one limit value. If the at least one limit value is exceeded, a corresponding signal is sent to the control device 6 to immediately terminate the transmission operation of the transmitter device 1.

FIG. 2 shows a flow diagram of an exemplary embodiment of the method. In act 11, a scatter parameter matrix is determined for the high-frequency coil 2 initially using a calibration measurement in the case of an unloaded high-frequency coil 2 (e.g., without patients). In the case of a single channel, the one remaining scatter parameter may also be a "loss scaling factor." The scatter matrix describes the coil losses ultimately for the multi-channel situation, so that if amplitude and phase of the voltage are known, the coil power loss may be determined.

In parallel, in acts 12 and 13, the measured values of the first measuring devices 9a, 9b and the second measuring devices 10a, 10b are evaluated. The overall power is determined in act 12 from the measured values of the second measuring devices 10a, 10b. In each case, a moving average for each of one of two time windows is determined (e.g., time windows of ten seconds and 360 seconds). The result of act 12 is thus an overall power, movingly averaged over the last ten seconds or 360 seconds.

In act 13, the scatter parameter matrix determined in act 11 is used to determine the coil power loss from the measured values of the first measuring devices (e.g., the amplitude and the phase of the voltage). Two moving averages are again determined, one for the time window of ten seconds and one for the time window of 360 seconds.

Because of the use of a DSP as an arithmetic device 8, the scanning may be performed extremely fast (e.g., new measured values may be recorded every 10 microseconds).

In act 14, SAR values are determined for both the time windows by first subtracting the coil power loss from the overall power. The moving averages assigned to corresponding time windows are taken into account. The two SAR values are produced from the product of this power absorbed by the patient and a previously determined conversion factor 15.

The conversion factor describes the region of the patient's body exposed to the high-frequency emission and the accuracy of measurement existing. This is sufficiently known from the prior art and is not further described here.

In act 16, a check is made at regular intervals (e.g., every second or a more frequent check) as whether the SAR values exceed assigned limit values in each case. If the SAR values exceed the assigned limit values, arrow 17, the transmission operation of the transmitter device 1 is terminated in act 18 in order to protect the patient. Otherwise, as indicated by the box 19, the SAR monitoring is continued (e.g., measured values are further recorded, moving averages formed and SAR values calculated).

The method terminates safely even in the event of an error if high power of an incorrect frequency (e.g., outside the frequency range of the first measuring device 9a, 9b) is generated, without further calculations being necessary. The first measuring devices 9a, 9b record no measured values, so that little if any coil power loss is subtracted and consequently the limit values are reached faster. In the event of an error or a worst case, the SAR monitoring advantageously becomes even more sensitive.

FIG. 3 shows a schematic diagram of one embodiment of a magnetic resonance device 20. The magnetic resonance device 20 includes a main field magnet unit 21 with patient accommodation 22, into which a patient couch 23 may be moved.

The magnetic resonance device 20 further includes the transmitter device 1. The high-frequency coil 2 may, for example, be disposed immediately behind a covering of the patient accommodation 22.

Other components of magnetic resonance devices are known in the prior art and are not explained here further.

Although the invention has been further illustrated and described in detail using the exemplary embodiment, the invention is not restricted by the disclosed examples. Other variations may be derived therefrom by the person skilled in the art without departing from the scope of protection of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for monitoring patient exposure during an examination with a magnetic resonance device, the magnetic resonance device comprising a transmitter device with a high-frequency coil that is actuatable via a plurality of transmission channels, at least two power amplifiers being used to supply power to the plurality of transmission channels, wherein for each transmission channel of the plurality of transmission channels, a narrowband first measuring device configured to measure an amplitude and a phase of a voltage in a defined frequency range around a magnetic resonance frequency and a broadband second measuring device covering a wider frequency range than the first measuring device and configured to record voltage measurement values suitable for determining an overall power are used, the method comprising:

determining a coil power loss from the measured amplitude and the measured phase of the first measuring device;

determining an overall transmitted power from the voltage measurement values of the second measuring device;

determining a specific absorption rate (SAR) value describing a power entering a patient from the coil power loss and the overall transmitted power and comparing the SAR value with at least one limit value; and terminating a transmission operation of the transmitter device when the at least one limit value is exceeded.

2. The method as claimed in claim 1, wherein a defined frequency range of less than 500 kHz around the magnetic resonance frequency is used.

3. The method as claimed in claim 2, wherein the defined frequency range around the magnetic resonance frequency is less than 250 kHz.

4. The method as claimed in claim 1, wherein the first measuring device and the second measuring device are coupled via a directional coupler.

5. The method as claimed in claim 1, further comprising determining, using the second measuring device, a forward power and a reflected power, the overall power being the difference between the forward power and the reflected power.

6. The method as claimed in claim 1, wherein determining the coil power loss from the measured amplitude and the measured phase comprises taking a previously determined scatter parameter matrix for the high-frequency coil into account.

7. The method as claimed in claim 6, further comprising determining the scatter parameter matrix in the context of a calibration measurement without patients.

8. The method as claimed in claim 1, wherein determining the SAR value comprises determining the SAR value from a difference between the overall power and the coil power loss using a conversion factor.

9. The method as claimed in claim 8, wherein the conversion factor is dependent on an exposed region of the patient, a measuring accuracy of the first measuring device and the second measuring device, or the exposed region and the measuring accuracy.

10. The method as claimed in claim 1, wherein determining the SAR value comprises determining the SAR value as a moving average across a predetermined time window.

11. The method as claimed in claim 10, wherein the time window is 10 seconds.

12. The method as claimed in claim 10, wherein the time window is 360 seconds.

13. The method as claimed in claim 10, wherein determining the SAR value comprises determining the SAR value by averaging the coil power loss and the overall power.

14. The method as claimed in claim 11, wherein determining the SAR value comprises determining the SAR value by averaging the coil power loss and the overall power.

15. The method as claimed in claim 12, wherein determining the SAR value comprises determining the SAR value by averaging the coil power loss and the overall power.

16. The method as claimed in claim 1, wherein the measured amplitude, the measured phase, and the voltage measurement values are scanned and processed in a digital signal processor.

17. The method as claimed in claim 1, wherein a number of power amplifiers corresponding to the number of transmission channels of the plurality of transmission channels are used.

18. A transmitter device for a magnetic resonance device, the transmitter device comprising:

a high-frequency coil that is accountable via a plurality of transmission channels;

at least two power amplifiers operable to supply power to the plurality of transmission channels;

a monitoring device that, for each transmission channel of the plurality of transmission channels connected downstream of the at least two power amplifiers, has a narrowband first measuring device configured to measure an amplitude and a phase of a voltage in a defined frequency range around a magnetic resonance frequency, and a broadband second measuring device covering a wider frequency range than the first measuring device and configured to record voltage measurement values suitable for determining an overall power; and an arithmetic device configured to:

determine a coil power loss from the measured amplitude and the measured phase of the first measuring device;

determine an overall transmitted power from the voltage measurement values of the second measuring device;

determine a specific absorption rate (SAR) value describing a power entering a patient from the coil power loss and the overall transmitted power and compare the SAR value with at least one limit value; and terminate a transmission operation of the transmitter device when the at least one limit value is exceeded.

19. The transmitter device as claimed in claim 18, wherein the at least two power amplifiers comprise a plurality of power amplifiers corresponding to the number of transmission channels.

20. A magnetic resonance device comprising:

a transmitter device comprising:

a high-frequency coil that is accountable via a plurality of transmission channels;

at least two power amplifiers operable to supply power to the plurality of transmission channels;

a monitoring device that, for each transmission channel of the plurality of transmission channels connected downstream of the at least two power amplifiers, has a narrowband first measuring device configured to measure an amplitude and a phase of a voltage in a defined frequency range around a magnetic resonance frequency, and a broadband second measuring device covering a wider frequency range than the first measuring device and configured to record voltage measurement values suitable for determining an overall power; and an arithmetic device configured to:

determine a coil power loss from the measured amplitude and the measured phase of the first measuring device;

determine an overall transmitted power from the voltage measurement values of the second measuring device;

determine a specific absorption rate (SAR) value describing a power entering a patient from the coil power loss and the overall transmitted power and compare the SAR value with at least one limit value; and terminate a transmission operation of the transmitter device when the at least one limit value is exceeded.

21. A method for monitoring patient exposure during an examination with a magnetic resonance device, the method comprising:

determining a coil power loss from a measured amplitude and a measured phase of a first measuring device;

determining an overall transmitted power from voltage measurement values of a second measuring device;

determining a specific absorption rate (SAR) value describing a power entering a patient from the coil power loss and the overall transmitted power, and comparing the SAR value with at least one limit value; and terminating a transmission operation of a transmitter device of the magnetic resonance device when the at least one limit value is exceeded.

* * * * *